(12) United States Patent
Yoshino

(10) Patent No.: US 7,105,888 B2
(45) Date of Patent: Sep. 12, 2006

(54) NONVOLATILE SEMICONDUCTOR MEMORY DEVICE AND METHOD OF MANUFACTURING SAME

(75) Inventor: Akira Yoshino, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 41 days.

(21) Appl. No.: 10/396,473

(22) Filed: Mar. 26, 2003

(65) Prior Publication Data

US 2003/0185071 A1    Oct. 2, 2003

(30) Foreign Application Priority Data

Mar. 27, 2002 (JP) .............................. 2002-089139

(51) Int. Cl.
*H01L 29/76* (2006.01)
(52) U.S. Cl. .................. 257/324; 257/314; 257/325; 257/410; 257/411; 257/321; 257/390
(58) Field of Classification Search .................... None
See application file for complete search history.

(56) References Cited

U.S. PATENT DOCUMENTS

| | | | |
|---|---|---|---|
| 5,723,890 A * | 3/1998 | Fujihira et al. ............. 257/339 |
| 5,768,192 A | 6/1998 | Eitan | |
| 5,966,603 A * | 10/1999 | Eitan ........................... 438/258 |
| 6,057,574 A * | 5/2000 | Hisamune ................... 257/315 |
| 6,137,134 A | 10/2000 | Nakagawa | |
| 6,172,905 B1 | 1/2001 | White et al. | |
| 6,285,055 B1 | 9/2001 | Gosain et al. | |
| 6,310,376 B1 * | 10/2001 | Ueda et al. .................. 257/315 |
| 6,331,721 B1 * | 12/2001 | Sung et al. .................. 257/317 |
| 6,368,916 B1 | 4/2002 | Nakagawa | |
| 6,426,252 B1 * | 7/2002 | Radens et al. .............. 438/243 |
| 6,468,861 B1 | 10/2002 | Iijima | |
| 2001/0021133 A1 | 9/2001 | Iijima | |
| 2002/0033501 A1 | 3/2002 | Sakagami | |
| 2003/0100153 A1 | 5/2003 | Kunori | |

FOREIGN PATENT DOCUMENTS

| | | |
|---|---|---|
| JP | 5-326893 | 12/1993 |
| JP | 10-335493 | 12/1998 |
| JP | 11-274420 | 10/1999 |
| JP | 2000-49245 | 2/2000 |
| JP | 2001-118943 | 4/2001 |
| JP | 2001-217328 | 8/2001 |
| JP | 2001/326288 | 11/2001 |
| JP | 2003-163289 | 6/2003 |
| JP | 2003-218243 | 7/2003 |
| WO | WO 00/54335 | 9/2000 |

* cited by examiner

*Primary Examiner*—Nathan J. Flynn
*Assistant Examiner*—Fazli Erdem
(74) *Attorney, Agent, or Firm*—Foley & Lardner LLP

(57) ABSTRACT

A first insulating layer, a second insulating layer, a third insulating layer, a first conductive layer, and an oxidation inhibitor film are successively deposited on a surface of a semiconductor substrate. After the oxidation inhibitor film and the first conductive layer are processed into strips, the assembly is thermally oxidized using the oxidation inhibitor film and the first conductive layer as a mask, thus forming thermal oxide films on first and second diffused layers. Then, a second conductive film is formed over the thermal oxide films and the first conductive layer, and then processed into a desired shape thereby to form an interconnection layer.

8 Claims, 13 Drawing Sheets

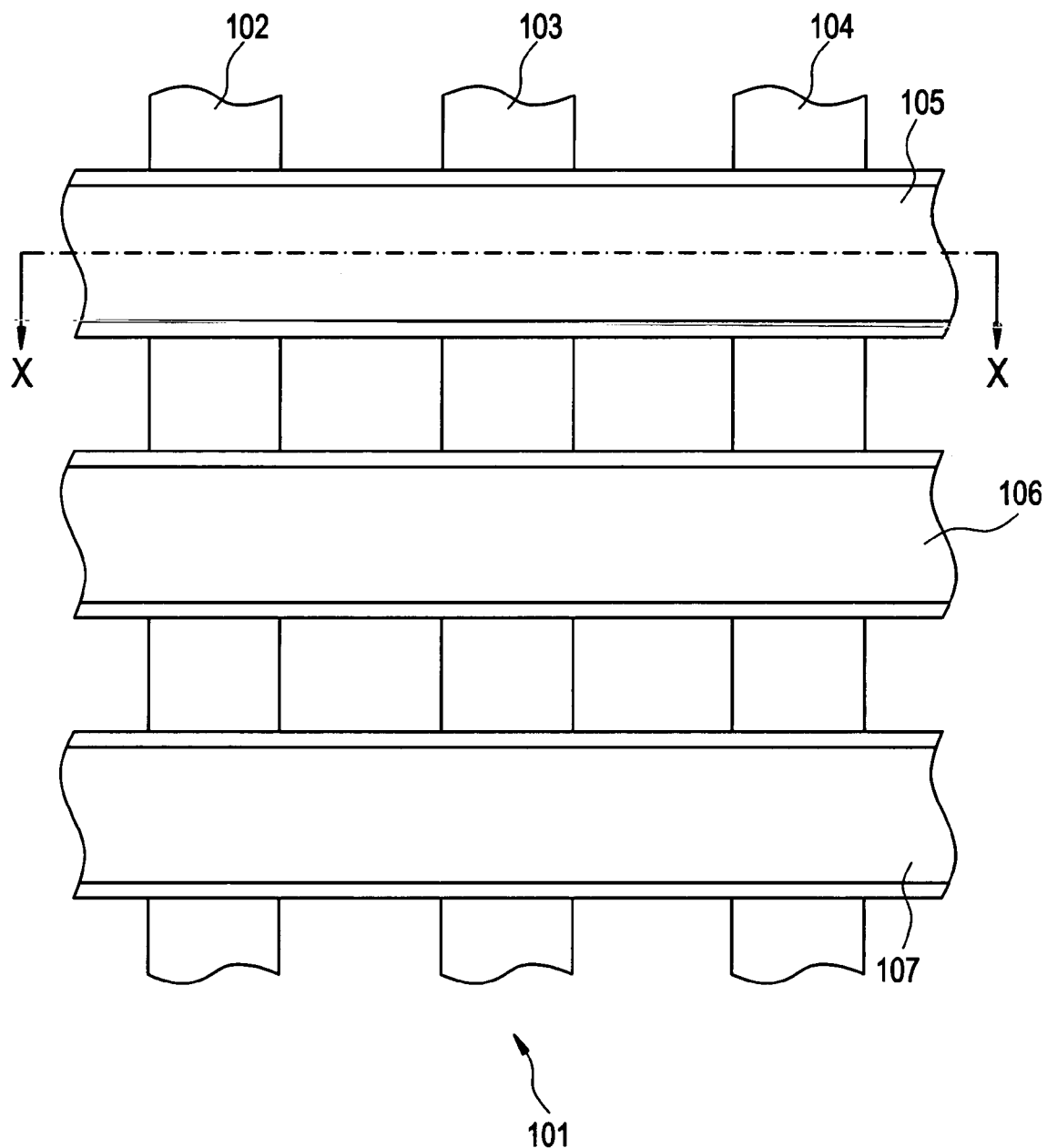

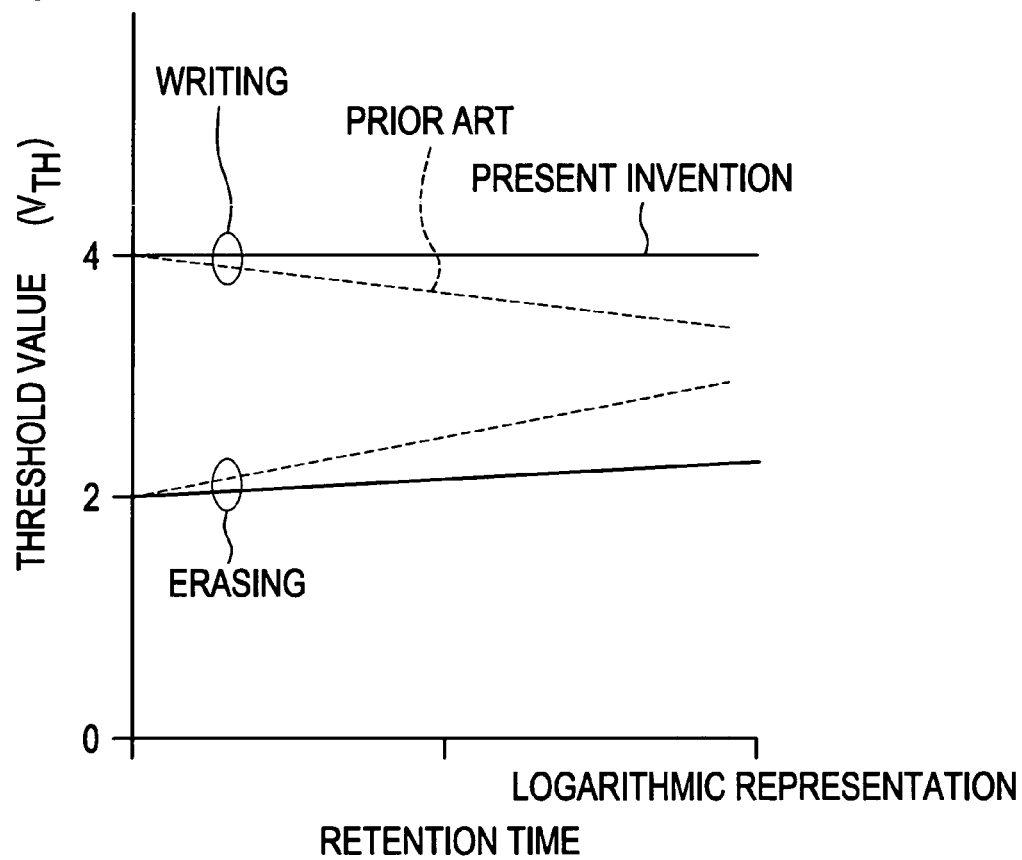

NONVOLATILE SEMICONDUCTOR MEMORY DEVICE AND METHOD OF MANUFACTURING SAME

BACKGROUND OF THE INVENTION

1. Field of the Invention

The present invention relates to a nonvolatile semiconductor memory device, and more particularly to a nonvolatile semiconductor memory device having MONOS (Metal Oxide Nitride Oxide Semiconductor) transistors and a method of manufacturing such a nonvolatile semiconductor memory device.

2. Description of the Related Art

MIS (Metal Insulator Semiconductor) transistors are classified broadly into two types, i.e., MNOS (Metal Nitride Oxide Semiconductor) transistors and FG (Floating Gate) transistors.

The MNOS transistors in the former category have gate insulating films as two layers for storing an information charge in an interface region that is formed in the boundary between the gate insulating films. The MNOS transistors include a structure referred to as MONOS which has a silicon oxide film formed on a silicon nitride film. Other known structures of MNOS transistors have combinations of various insulating films other than the silicon oxide film and the silicon nitride film.

The FG transistors in the latter class have two gate electrodes including a first gate electrode as a floating gate electrode for storing an information charge. According to the structure of the FG transistors, the first gate electrode is formed as a floating gate electrode on a silicon oxide film grown on a principal surface of a semiconductor substrate, and an interlayer insulating film comprising a silicon oxide film and a silicon nitride film is formed over the first gate electrode. A second gate electrode as a control gate electrode is formed over the interlayer insulating film.

Nonvolatile memories referred to as a flash memory generally use M(O)NOS transistors or FG transistors as memory elements. However, all presently mass-produced flash memories use FG transistors as memory elements. The FG transistors have, in principle, a poor ability to retain an information charge, and need a relatively thick silicon oxide film having a thickness of 9 nm or more as a tunnel oxide film between the principal surface of a semiconductor substrate and a floating gate electrode. Therefore, there is a limit to reducing a voltage for writing and erasing information.

On the other hand, the MNOS transistors allow a tunnel oxide film to be thinned out between the principal surface of a semiconductor substrate and a floating gate electrode, and hence can use a thin tunnel oxide film having a thickness of 3 nm or less. Therefore, it is possible in principle to reduce an operating voltage for the MNOS transistors, in particular, a voltage for writing and erasing information.

A memory element which uses an MNOS transistor writes and erases information as follows:

In the MNOS transistor, information is written by introducing an information charge (e.g., electrons) from the semiconductor substrate into the interface region, and information is erased by discharging an information charge from the interface region into the semiconductor substrate, directly through the tunnel of a silicon oxide film which is deposited to a thickness of about 2 nm on the principal surface of the semiconductor substrate. The interface region serves as a major trap for electrons. The state of the memory element where the information charge is retained therein corresponds to a logic "1" for stored information and the state of the memory element where the information charge is erased therefrom corresponds to a logic "0" for stored information. In recent years, various studies have intensively been carried out for making efforts to use M(O)NOS transistors capable of writing and erasing information at low voltages as memory elements for nonvolatile semiconductor memory devices such as flash memories.

Flash memories which use MONOS transistors as memory elements have a basic structure as disclosed in U.S. Pat. No. 5,768,192, for example. Recently, a NROM (Nitride Read Only Memory) fabrication method capable of greatly simplifying a nonvolatile memory fabrication process is disclosed in U.S. Pat. No. 5,966,603. The memory elements of the NROM have a basic structure which is the same as the basic structure disclosed in U.S. Pat. No. 5,768,192.

A conventional nonvolatile semiconductor memory device as the NROM will be described below with reference to FIGS. 1 through 5 of the accompanying drawings. Basic operation of the NROM will also be described below. FIG. 1 shows only interconnections of the NROM for the sake of brevity.

As shown in FIG. 1, NROM cells for storing information are constructed of first diffused layer 102, second diffused layer 103, and third diffused layer 104 which are formed in silicon substrate 101, and word lines 105, 106, 107 disposed on and extending perpendicularly to first through third diffused layers 102, 103, 104. First through third diffused layers 102, 103, 104 serve as respective bit lines.

An NROM fabrication process will be described below with reference to FIGS. 2A through 2D of the accompanying drawings. As shown in FIG. 2A, first insulating film 108 is formed on silicon substrate 101 by thermal oxidation, and then a silicon nitride film is grown on first insulating film 108 by CVD (Chemical Vapor Deposition), thereby forming second insulating film 109.

Thereafter, resist mask 110 having a plurality of rectangular openings (slits) is formed on second insulating film 109 by a known lithographic process. Those portions of second insulating film 109 which are aligned with the openings in resist mask 110 are then etched away. Then, as shown in FIG. 2B, an N-type impurity such as arsenic is introduced into silicon substrate 101 through the openings in resist mask 110 by way of ion implantation, followed by the removal of resist mask 110.

Then, the assembly is heated to activate the introduced impurity, producing first diffused layer 102, second diffused layer 103, and third diffused layer 104 in silicon substrate 101 near its surface.

Thereafter, as shown in FIG. 2C, the entire surface formed so far is thermally oxidized at a temperature of 750° C. or higher, producing insulative films 111 having a thickness of about 100 nm on first diffused layer 102, second diffused layer 103, and third diffused layer 104, respectively. At the same time, the surface of second insulating film 109 is also thermally oxidized into third insulating film 112. In this manner, there is produced an insulating film of ONO (Oxide Nitride Oxide) structure which is made up of third insulating film 112 (silicon oxide film), second insulating film 109 (silicon nitride film), and first insulating film 108 (silicon oxide film). Then, as shown in FIG. 2D, a tungsten polycide film having a thickness of about 200 nm, which will serve as a conductive film, is deposited on the entire surface formed so far, and then processed into a desired shape by a known lithographic process and a known dry etching process, thus forming word lines 105.

In this manner, bit lines comprising first diffused layer 102, second diffused layer 103, and third diffused layer 104 are formed on silicon substrate 101, thus producing regions for writing and erasing information which have the ONO structure made up of first insulating film 108, second insulating film 109, and third insulating film 112. As shown in FIG. 1, word lines 105, 106, 107 are provided to complete NROM cells.

Operation of MONOS transistors which serve as the NROM cells will be described below with reference to FIGS. 3A and 3B of the accompanying drawings.

For writing information in a MONOS transistor, as shown in FIG. 3A, for example, silicon substrate 101 and first diffused layer 102 are connected to ground potential, and a voltage $V_W=3$ V is applied to second diffused layer 103 and a voltage $V_{GW}=5$ V is applied to gate electrode 105a. When these voltages are applied, electron flow 113 (channel current) is generated from first diffused layer 102 as a source to second diffused layer 103 as a drain. Channel hot electrons (CHE) are generated in the vicinity of second diffused layer 103, and some of the generated channel hot electrons flow beyond the barrier of first insulating film 108 and are trapped by second insulating film 109, i.e., trap region 114 thereof. Thus, when information is written, electrons as an information charge is stored in a region of second insulating film 109 near second diffused layer 103.

For reading information from the MONOS transistor, as shown in FIG. 3B, second diffused layer 103 as a source is connected to ground potential, and a voltage $V_R=1.5$ V is applied to first diffused layer 102 as a drain and a voltage $V_{GR}=3$ V is applied to gate electrode 105a. Silicon substrate 101 is connected to ground potential.

When these voltages are applied, if the state of trap region 114 is a logic "1" with electrons stored therein, then no current flows between first diffused layer 102 and second diffused layer 103. However, if the state of trap region 114 is a logic "0" with no electrons stored therein, then a current flows between first diffused layer 102 and second diffused layer 103. The written information can be read by detecting the current.

For erasing the information written in the MONOS transistor, as shown in FIG. 3A, for example, silicon substrate 101 and first diffused layer 102 are connected to ground potential, and a voltage $V_E=5$ V is applied to second diffused layer 103 and a voltage $V_{GE}=-5$ V is applied to gate electrode 105a.

When these voltages are applied, holes generated by interband tunneling due to band bending are introduced into trap region 114 where an end of second diffused layer 103 overlaps gate electrode 105a, and coupled with the electrons as the information charge, thereby erasing the written information.

The NROM described above can be arranged in a two-bit/one-cell structure. Such a two-bit/one-cell structure will be described below with reference to FIG. 4 of the accompanying drawings.

As shown in FIG. 4, NROM bit lines comprising first diffused layer 102 and second diffused layer 103 and covered with insulating films 111 on the diffused layers are formed on silicon substrate 101. Regions for writing and erasing an information are formed between those NROM bit lines, the regions comprising first insulating film 108, second insulating film 109, and third insulating film 112 that make up an ONO structure. In the NROM, first bit trap region 114 and second bit trap region 115 are formed as two regions for writing and erasing information, i.e., electron trap regions. These regions operate basically in the same manner as with trap region 114 described above with reference to FIGS. 3A and 3B. The NROM can thus be constructed in a multivalued fashion, achieving the above two-bit/one-cell structure.

The inventor of the present invention has conducted various experiments on the above NROM, and found some problems with the NROM. These problems with the NROM will be described below with reference to FIG. 5.

The first problem is that when insulating film 111 is formed on the diffused layer by way of thermal oxidization, insulating film 111 grows laterally and goes into first insulating film 108 by increased distance $\Delta W_1$ as shown in FIG. 5. With increased distance $\Delta W_1$, the dimension between the diffused layers, e.g., between first diffused layer 102 and second diffused layer 103, is reduced, giving rise to a known short channel effect. The short channel effect restricts miniaturization of the cells of the NROM, posing limitations on efforts to make the NROM highly packed or integrated.

The second problem is that when the surface of second insulating film 109 which comprises a silicon nitride film is thermally oxidized into third insulating film 112, nitrogen atoms in second insulating film 109 find their way into first insulating film 108 and reach the surface of silicon substrate 101. The nitrogen or $NH_3$ (generated by a reaction between the oxidizing gas and the nitrogen) which has entered first insulating film 108 thermally nitrides a portion of the silicon oxide film serving as first insulating film 108. The nitrogen or $NH_3$ which has reached surface of silicon substrate 101 reacts with silicon substrate 101, producing foreign matter 116 of silicon nitride. The thermally nitrided portion of first insulating film 108 or generated foreign matter 116 adversely affects the ability to retain an information charge, i.e., greatly reduces the retention time of an information charge.

SUMMARY OF THE INVENTION

It is therefore an object of the present invention to provide a nonvolatile semiconductor memory device such as NROM or the like which can easily be designed for a higher packing density, a higher storage capacity, a multifunction capability, a lower operating voltage, and a higher speed of operation, and a method of manufacturing such a nonvolatile semiconductor memory device.

To achieve the above object, according to an aspect of the present invention, a first insulating layer, a second insulating layer, a third insulating layer, a first conductive layer, and an oxidation inhibitor film are successively deposited on a surface of a semiconductor substrate. After the oxidation inhibitor film and the first conductive layer are processed into strips, the assembly is thermally oxidized using the oxidation inhibitor film and the first conductive layer as a mask, thus forming thermal oxide films on first and second diffused layers. Then, a second conductive film is formed over the thermal oxide films and the first conductive layer.

According to another aspect of the present invention, a first insulating layer, a second insulating layer, a third insulating layer, and a first conductive layer are successively deposited on a surface of a semiconductor substrate. After the first insulating layer, the second insulating layer, and the third insulating layer are processed into strips, HTO (High Temperature Oxide) films are formed on first and second diffused layers to fill gaps between the strips of the first conductive layer. Then, a second conductive film is formed over the HTO films and the first conductive layer.

According to still another aspect of the present invention, a first insulating layer, a second insulating layer, a third insulating layer, a first conductive layer, and an etching inhibitor film are successively deposited on a surface of a semiconductor substrate. After the etching inhibitor film, the first conductive layer, the third insulating layer, and the second insulating layer are processed into strips, side wall insulating films are formed on side walls of the first conductive layer, and surfaces of first and second diffused layers are exposed. Silicide layers are formed on the exposed surfaces of the first and second diffused layers, and HTO films are formed on the silicide layers to fill gaps between the strips of the first conductive layer. Then, a second conductive film is formed over the HTO films and the first conductive layer.

According to yet still another aspect of the present invention, a first insulating layer, a grain-like material, a third insulating layer, and a first conductive layer are successively deposited on a surface of a semiconductor substrate. After the first conductive layer is processed into strips, insulating films are formed on first and second diffused layers to fill gaps between the strips of the first conductive layer. Then, a second conductive film is formed over the insulating films and the first conductive layer.

With the above arrangements, the insulating films can be formed on the first and second diffused layers with high accuracy (highly accurate dimensions, etc.). Therefore, memory cells can be formed in a highly fine pattern, and a nonvolatile semiconductor memory device can be designed for a higher packing density and a higher integration level.

According to the present invention, any reduction in the insulation capability due to thermal nitridation of the first insulating layer is greatly suppressed in a process of manufacturing a nonvolatile semiconductor memory device such as NROM cells. Furthermore, information charges can be retained by grain-like material regions. Therefore, the ability of a nonvolatile semiconductor memory device to retain information charges is greatly increased. Stated otherwise, a nonvolatile semiconductor memory device can be designed for a higher function (performance) capability and a multifunction capability.

According to the present invention, because grain-like materials which may be hemispherical in shape serve as regions for writing information, the nonvolatile semiconductor memory device can easily be designed for storing information in multiple values, e.g., in a four-bit/one-cell structure.

If the present invention is applied to a flash memory, then the flash memory offers the above advantages and also allows stored information to be read at a high speed. Furthermore, the flash memory can be mass-produced with utmost ease at a greatly reduced cost.

With those improved characteristics, the flash memory can find a wider range of usage and can be used in new applications.

The above and other objects, features, and advantages of the present invention will become apparent from the following description with reference to the accompanying drawings which illustrate examples of the present invention.

BRIEF DESCRIPTION OF THE DRAWINGS

FIG. 1 is a fragmentary plan view of an arrangement of a conventional nonvolatile semiconductor memory device;

FIG. 13 is a graph showing information charge retention characteristics of the nonvolatile semiconductor memory device according to the fourth embodiment of the present invention.

DETAILED DESCRIPTION OF THE PREFERRED EMBODIMENTS

1st Embodiment

A nonvolatile semiconductor memory device according to a first embodiment of the present invention will be described below with reference to FIGS. 6A–6D through 8.

Figure 6A:
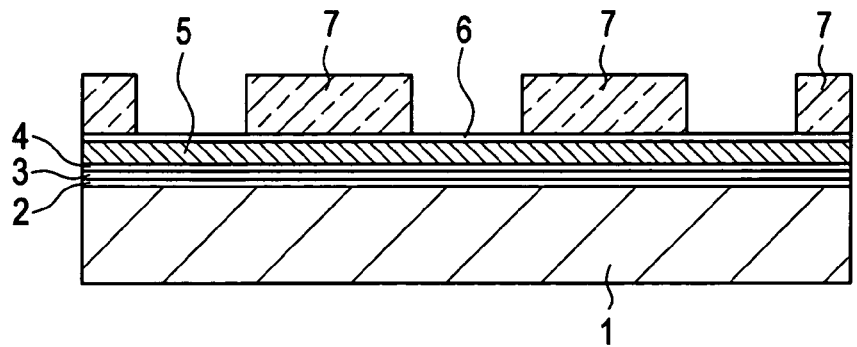
FIGS. 6A through 6D are fragmentary cross-sectional views illustrating a process of manufacturing a nonvolatile semiconductor memory device according to a first embodiment of the present invention.

According to a process of manufacturing the nonvolatile semiconductor memory device according to the first embodiment of the present invention, as shown in FIG. 6A, silicon substrate 1 is oxidized by radical or thermal oxidation to grow a silicon oxide film having a thickness of about 4 nm, which serves as first insulating film 2 as a first insulating layer. Then, a silicon nitride film having a thickness of about 7 nm is grown on first insulating film 2 by CVD, and the surface of the silicon nitride film is turned by radical oxidation into a silicon oxide film having a thickness of about 4 nm, producing an insulating film of ONO structure which comprises second insulating film 3 as a second insulating layer having a thickness of about 5 nm and third insulating film 4 as a third insulating layer having a thickness of about 4 nm.

Then, silicon layer 5 as a first conductive layer is deposited to cover third insulating film 4 by CVD. Silicon layer 5 comprises an undoped amorphous silicon film or a polysilicon film having a thickness of about 30 nm. Alternatively, a silicon germanium layer may be grown instead of silicon layer 5.

Silicon nitride film 6 as an oxidation inhibitor film having a thickness of about 50 nm is grown on silicon layer 5 by CVD. Then, resist mask 7 having a plurality of rectangular openings (slits) is formed on silicon nitride film 6 by a known lithographic process.

Figure 6B:
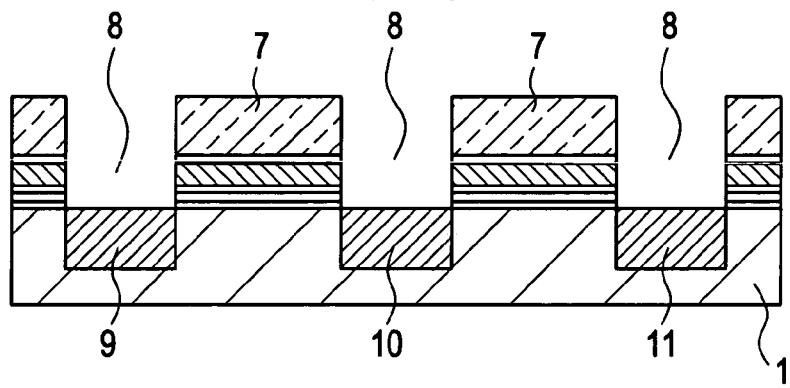

Then, as shown in FIG. 6B, silicon nitride film 6, silicon layer 5, third insulating film 4, and second insulating film 3 are successively etched away locally through the openings in resist mask 7 by a dry etching process, forming openings 8 therein. Thereafter, an impurity of arsenic is introduced into silicon substrate 1 through the openings in resist mask 7 by way of ion implantation, followed by the removal of resist mask 7. Then, the overall structure is heated to activate the introduced impurity, thus forming first diffused layer 9, second diffused layer 10, and third diffused layer 11 in silicon substrate 1 near its surface.

Figure 6C:
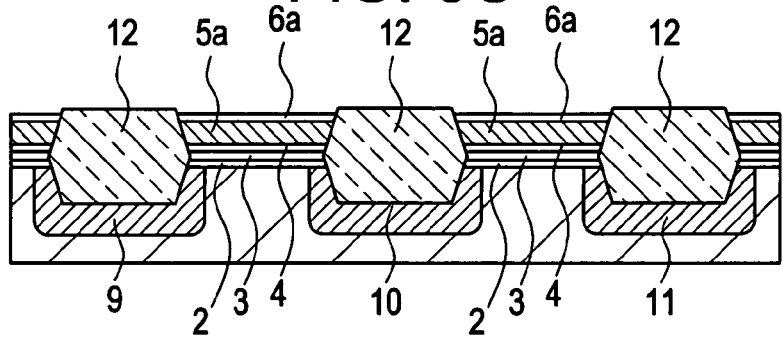

Then, as shown in FIG. 6C, the entire surface formed so far is thermally oxidized to form insulating films 12 having a thickness of about 100 nm on first diffused layer 9, second diffused layer 10, and third diffused layer 11, respectively. At this time, silicon layers 5a and silicon nitride films 6a in the shape of strips are formed on the insulating film of ONO structure.

Thereafter, silicon nitride films 6a in the shape of strips are etched away, and an N-type impurity is introduced into silicon layers 5a in the shape of strips.

Figure 6D:
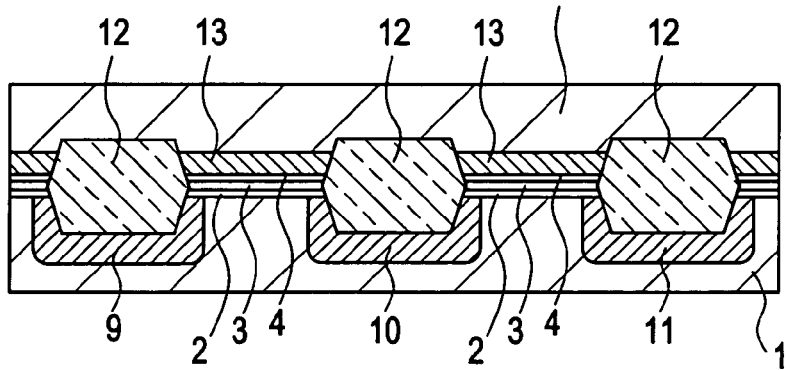

Then, as shown in FIG. 6D, a tungsten silicide film having a thickness of about 200 nm, which will serve as a second conductive film, is deposited on the entire surface formed so far, and then processed into a desired shape by a known lithographic process and a known dry etching process, thus forming word lines 14. When word lines 14 are formed, silicon layers 5a are also processed into a desired shape by a known lithographic process and a known dry etching process, thus forming gate electrodes 13.

In this manner, as shown in FIG. 6D, NROM bit lines including first diffused layer 9, second diffused layer 10, and third diffused layer 11 are formed on silicon substrate 1, thus producing regions for writing and erasing information which have the ONO structure made up of first insulating film 2, second insulating film 3, and third insulating film 4. Word lines 14 are also provided to complete a basic structure of NROM cells of the nonvolatile semiconductor memory device according to the first embodiment.

The process of manufacturing the nonvolatile semiconductor memory device according to the first embodiment of the present invention will further be described below with reference to FIGS. 7A through 7D.

Figure 7A:
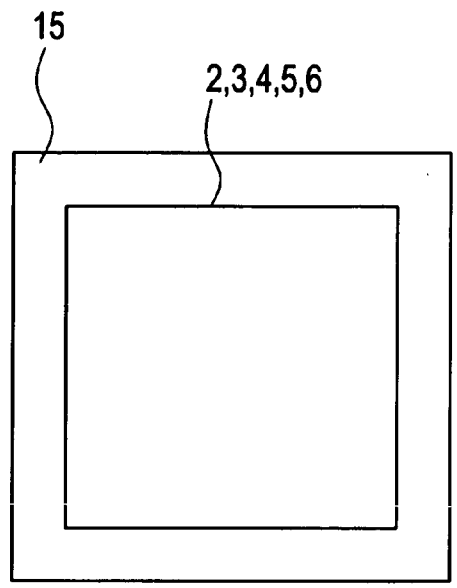
FIGS. 7A through 7D are plan views of respective structures produced in successive steps of the process illustrated in FIGS. 6A through 6D.

As shown in FIG. 7A, device separating region 15 is formed in a given area on a silicon substrate, and NROM cells are formed in an active region surrounded by device separating region 15. In this step, first insulating film 2, second insulating film 3, third insulating film 4, silicon layer 5, and silicon nitride film 6 are formed in the active region.

Figure 7B:
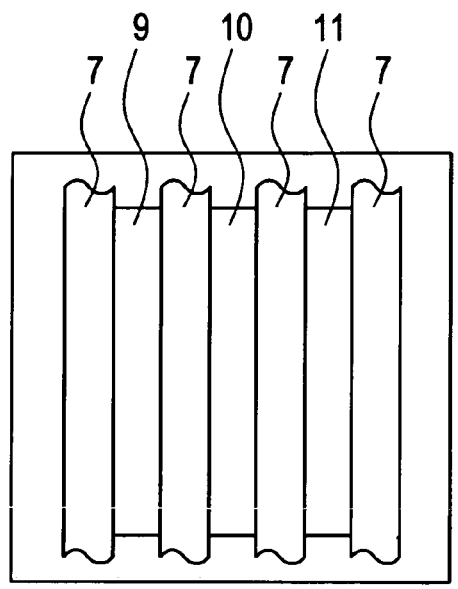

Then, as shown in FIG. 7B, resist mask 7 having slits, first diffused layer 9, second diffused layer 10, and third diffused layer 11 are formed. This step corresponds to the step shown in FIG. 6B.

Figure 7C:
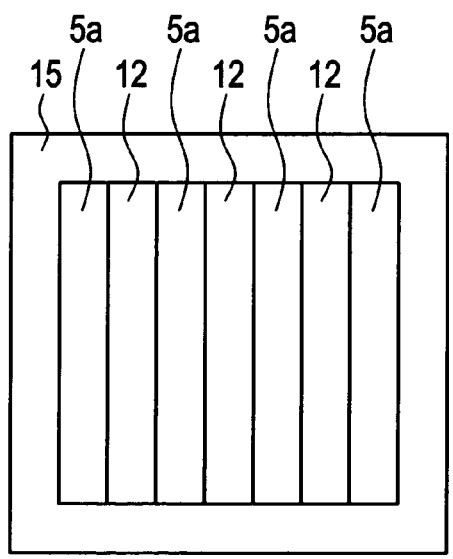

Then, as shown in FIG. 7C, after resist mask 7 is removed, insulating film 12 is formed on first diffused layer 9, second diffused layer 10, and third diffused layer 11 by thermal oxidation. In this step, silicon layer 5a in the shape of strips is formed. This step corresponds to the step shown in FIG. 6C.

Figure 7D:
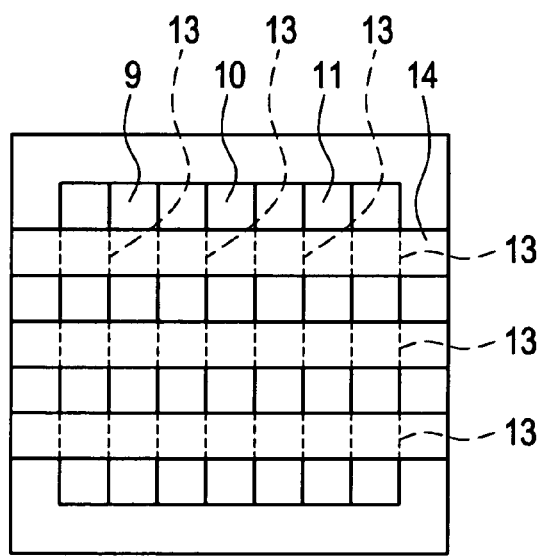

Then, as shown in FIG. 7D, a second conductive layer deposited over the entire surface and silicon layer 5a in the shape of strips are processed to form word lines 14 and gate electrodes 13. In this manner, bit lines provided by first diffused layer 9, second diffused layer 10, and third diffused layer 11 and word lines 14 are provided perpendicularly to each other.

Advantages provided by the nonvolatile semiconductor memory device according to the first embodiment of the present invention will be described below with reference to FIG. 8.

Figure 5:
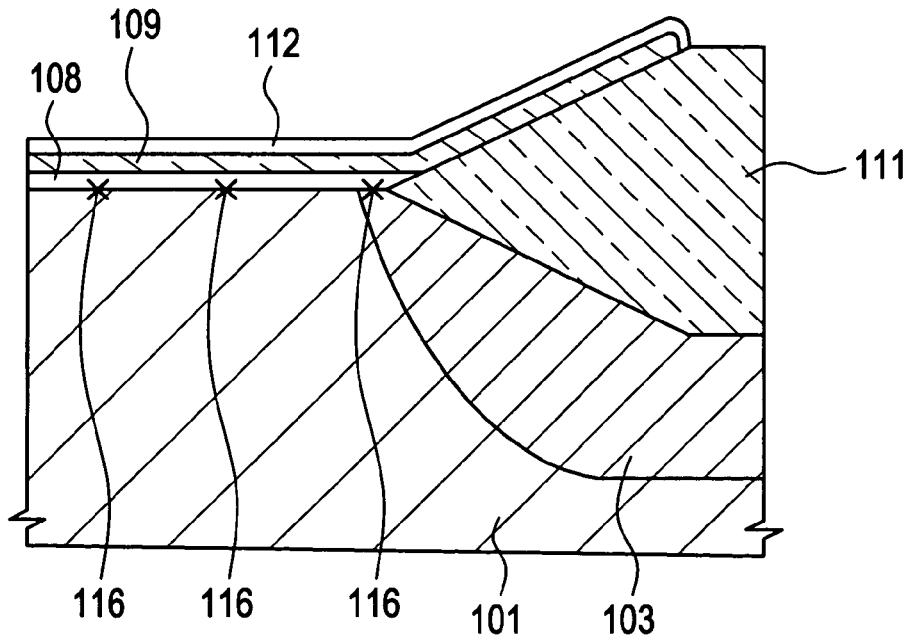
FIG. 5 is an enlarged fragmentary cross-sectional view of a portion of the NROM cell shown in FIG. 4.
Figure 8:
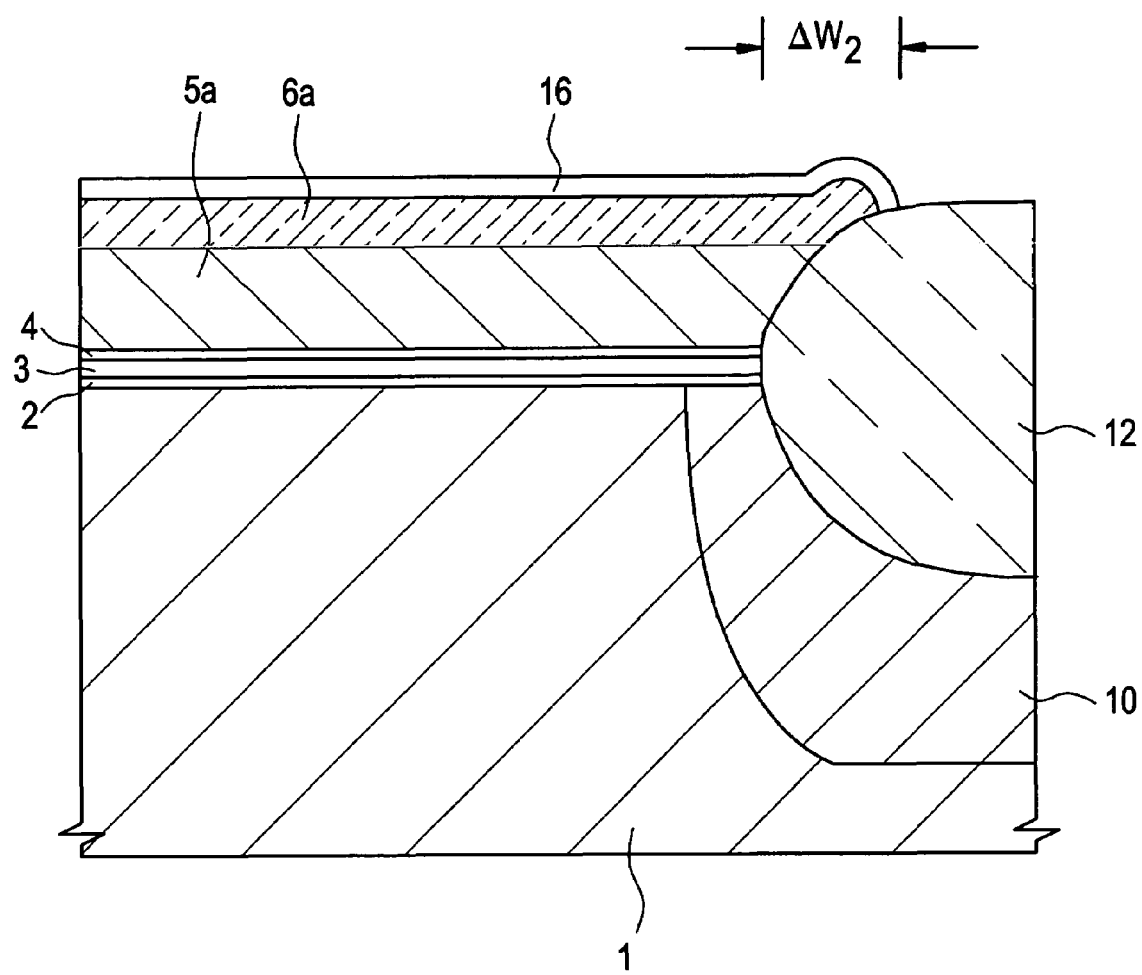
FIG. 8 is an enlarged fragmentary cross-sectional view illustrating advantages of the nonvolatile semiconductor memory device according to the first embodiment of the present invention.

According to the first embodiment, as shown in FIG. 8, when insulating film 12 is formed on the diffused layers by thermal oxidation, insulating film 12 grows laterally by greatly reduced distance $\Delta W_2$. Specifically, distance $\Delta W_2$ is equal to or less than one-half of distance $\Delta W_1$ shown in FIG. 5.

The reasons why insulating film 12 grows laterally by greatly reduced distance $\Delta W_2$ are as follows:

According to the first embodiment, in the above step of thermal oxidation, silicon layer 5a is formed on the ONO structure made up of first insulating film 2, second insulating film 3, and third insulating film 4, and then silicon nitride films 6a are formed on the surface of silicon layer 5a. Therefore, in the step of thermal oxidation, silicon nitride films 6a apply a large compressive stress to silicon layer 5a, preventing oxygen as an oxidizing agent from being diffused laterally. Because of the diffusion suppressing effect of oxygen, lateral oxidation is suppressed, resulting in greatly reduced distance $\Delta W_2$ by which insulating film 12 grows laterally. After the step of thermal oxidation, the surface of silicon nitride film 6a is oxidized into silicon oxide film 16.

In the present embodiment, second insulating film 3 which comprises a silicon nitride film is oxidized by radical oxidation. The radical oxidation allows the silicon nitride film to be easily oxidized at a low temperature of 700° C. or lower. According to this low-temperature oxidation process, any intrusion of nitrogen from second insulating film 3 into first insulating film 2 is greatly suppressed. Furthermore, in the step of thermal oxidation to form insulating film 12, silicon layer 5a functions as a protective film to protect second insulating film 3 from the thermal oxidation. The radical oxidation is carried out in oxygen excited by neutral radicals or ions, i.e., in an active oxygen atmosphere.

Therefore, any thermal nitridation of the silicon oxide film which serves as first insulating film 2 is substantially eliminated. No foreign matter is formed in the surface of silicon substrate 1. The information charge retention time of the NROM cells is thus prevented from being shortened.

When silicon substrate 1 is oxidized by radical oxidation to form first insulating film 2, the trapping of holes in the film is reduced, increasing the resistance at the time of erasing information. Therefore, the nonvolatile semiconductor memory device can write and erase information in the increased number of cycles.

2nd Embodiment

A nonvolatile semiconductor memory device according to a second embodiment of the present invention will be described below with reference to FIGS. 9A–9D and 10A through 10D.

The nonvolatile semiconductor memory device according to the second embodiment has an insulating film formed on diffused layers by a process of embedding an insulating film by way of CVD.

Figure 9A:
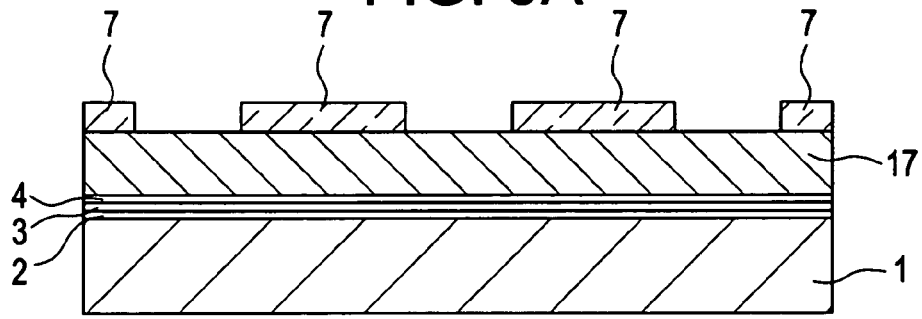
FIGS. 9A through 9D are fragmentary cross-sectional views illustrating a process of manufacturing a nonvolatile semiconductor memory device according to a second embodiment of the present invention.

According to a process of manufacturing the nonvolatile semiconductor memory device according to the second embodiment of the present invention, as shown in FIG. 9A, silicon substrate 1 is oxidized by radical or thermal oxidation to form first insulating film 2, as with the first embodiment. Then, a silicon nitride film having a thickness of about 7 nm is grown on first insulating film 2, and the surface of the silicon nitride film is turned by radical oxidation into a silicon oxide film having a thickness of about 4 nm, producing an insulating film of ONO structure which comprises second insulating film 3 having a thickness of about 5 nm and third insulating film 4 having a thickness of about 4 nm.

Then, conductive film 17 as a first conductive layer is deposited to cover third insulating film 4 by CVD. Conductive film 17 comprises an amorphous silicon film, a polysilicon film, or a silicon germanium film containing an N-type impurity and having a thickness of about 200 nm.

Figure 9B:
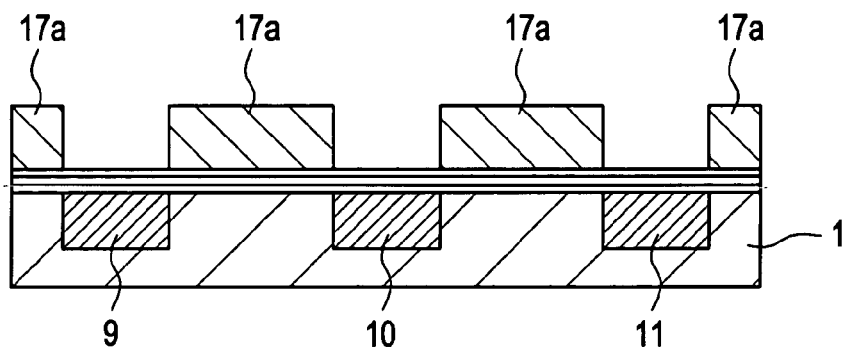

Then, resist mask 7 having a plurality of rectangular openings (slits) is formed or conductive film 17 by a known lithographic process. Then, as shown in FIG. 9B, conductive film 17 is etched away locally through the openings in resist mask 7 by a dry etching process, forming a pattern of strips as rectangular conductive films 17a, followed by the removal of resist mask 7. Then, an impurity of arsenic is introduced into silicon substrate 1 through the slits between rectangular conductive films 17a, which are used as a mask, by way of ion implantation. The overall structure is heated to activate the introduced impurity, thus forming first diffused layer 9, second diffused layer 10, and third diffused layer 11 in silicon substrate 1 near its surface.

Figure 9C:
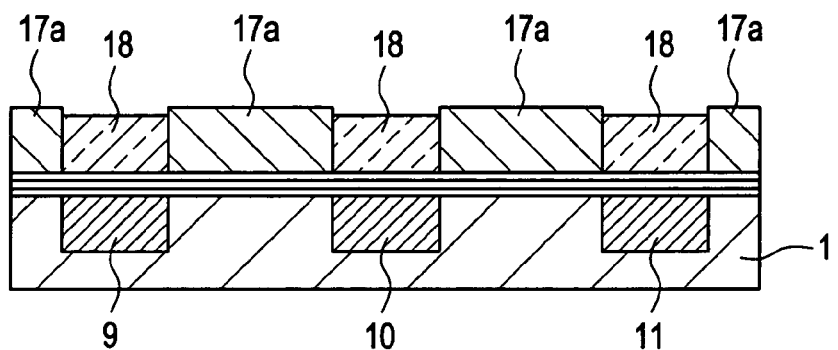

A silicon oxide film is then grown to a thickness of about 300 nm on the entire surface formed so far by CVD. Using rectangular conductive films 17a as a stopper, the silicon oxide film is polished to remove an unwanted portion thereof by a chemical mechanical polishing (CMP) process. In growing the silicon oxide film by way of CVD, reactive gases of monosilane ($SiH_4$) and nitrous oxide ($N_2O$) are used at a high growing temperature ranging from 700° C. to 800° C. for forming an HTO (High Temperature Oxide) film. As shown in FIG. 9C, thus, insulating film 18 comprising an HTO film having a thickness of about 200 nm is formed on first diffused layer 9, second diffused layer 10, and third diffused layer 11. Since the HTO film has an excellent step covering capability, it can completely fill up the slits between rectangular conductive films 17a. Furthermore, the HTO film has a very high insulating ability and a very high quality.

Figure 9D:
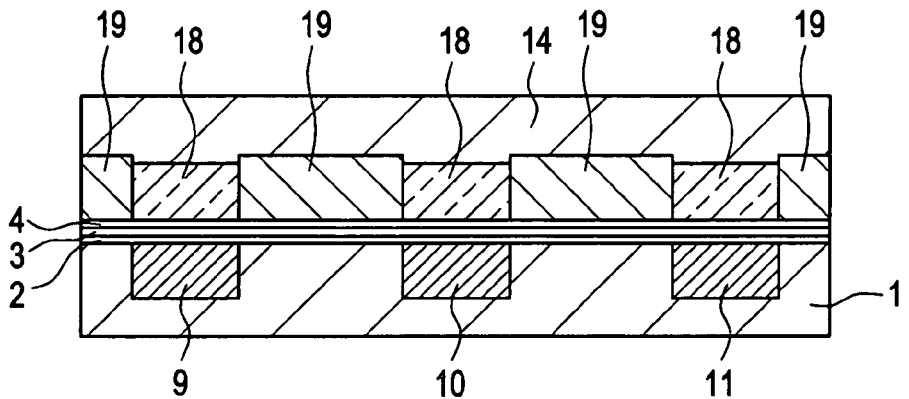

Then, as shown in FIG. 9D, a tungsten silicide film having a thickness of about 200 nm, which will serve as a second conductive film, is deposited on the entire surface formed so far, and then processed into a desired shape by a known lithographic process and a known dry etching process, thus forming word lines 14. When word lines 14 are formed, rectangular conductive films 17a are also processed into a desired shape by a known lithographic process and a known dry etching process, thus forming gate electrodes 19.

In this manner, bit lines including first diffused layer 9, second diffused layer 10, and third diffused layer 11 are formed on silicon substrate 1, thus producing regions for writing and erasing information which have the ONO structure made up of first insulating film 2, second insulating film 3, and third insulating film 4. Word lines 14 are also provided to complete a basic structure of NROM cells of the nonvolatile semiconductor memory device according to the second embodiment.

The process of manufacturing the nonvolatile semiconductor memory device according to the second embodiment of the present invention will further be described below with reference to FIGS. 10A through 10D.

Figure 10A:
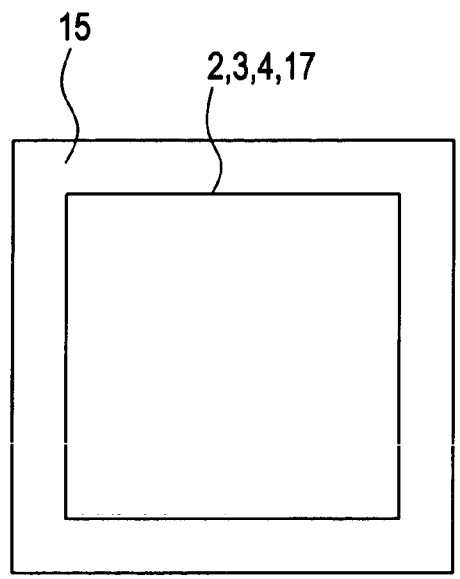
FIGS. 10A through 10D are plan views of respective structures produced in successive steps of the process illustrated in FIGS. 9A through 9D.

As shown in FIG. 10A, device separating region 15 is formed in a given area on a silicon substrate, and NROM cells are formed in an active region surrounded by device separating region 15. At this time, first insulating film 2, second insulating film 3, third insulating film 4, and conductive film 17 are formed in the active region in the step described above with reference to FIG. 9A.

Figure 10B:
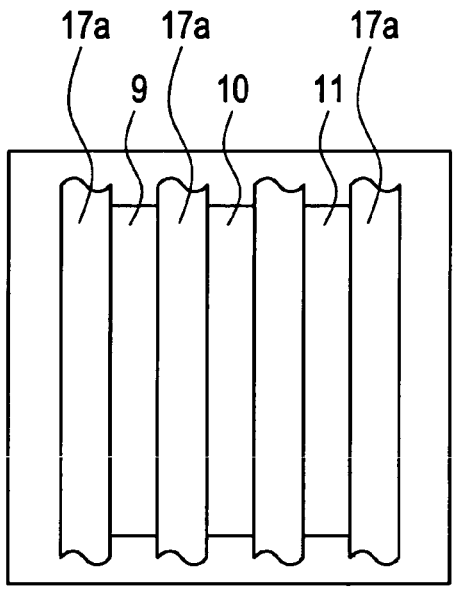

Then, as shown in FIG. 10B, rectangular conductive films 17a, first diffused layer 9, second diffused layer 10, and third diffused layer 11 are formed. This step corresponds to the step shown in FIG. 9B.

Figure 10C:
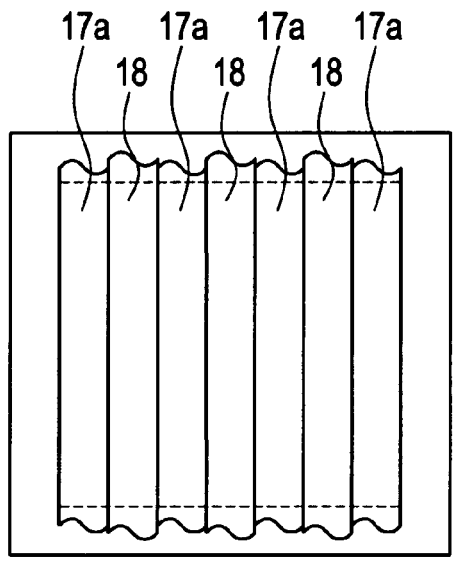

Then, as shown in FIG. 10C, insulating films 18 in the shape of strips are formed on first diffused layer 9, second diffused layer 10, and third diffused layer 11 by thermal oxidation. This step corresponds to the step shown in FIG. 9C.

Figure 10D:
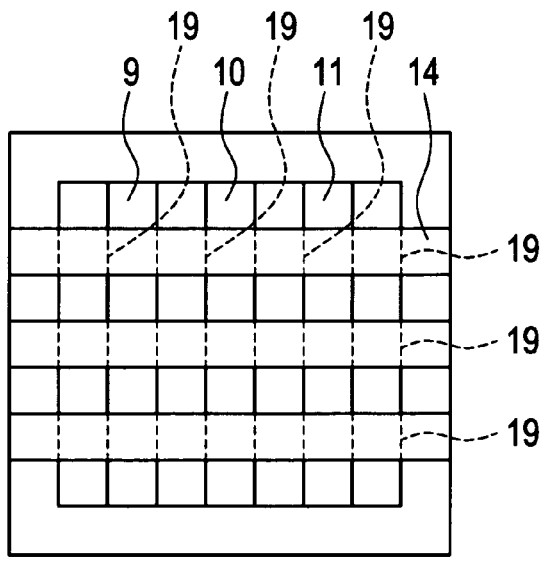

Then, as shown in FIG. 10D, a second conductive layer deposited over the entire surface and rectangular conductive films 17a are processed into a desired shape to form word lines 14 and gate electrodes 19. In this manner, bit lines provided by first diffused layer 9, second diffused layer 10, and third diffused layer 11 and word lines 14 are provided perpendicularly to each other.

The second embodiment offers the same advantages as those of the first embodiment. Moreover, there is almost no lateral growth of insulating films 18. Since the thickness of insulating films 18 can easily be increased, the parasitic capacitance between the NROM bit lines and word lines is greatly reduced.

3rd Embodiment

A nonvolatile semiconductor memory device according to a third embodiment of the present invention will be described below with reference to FIGS. 11A–11D.

The nonvolatile semiconductor memory device according to the third embodiment has a silicide layer formed on diffused layers.

Figure 11A:
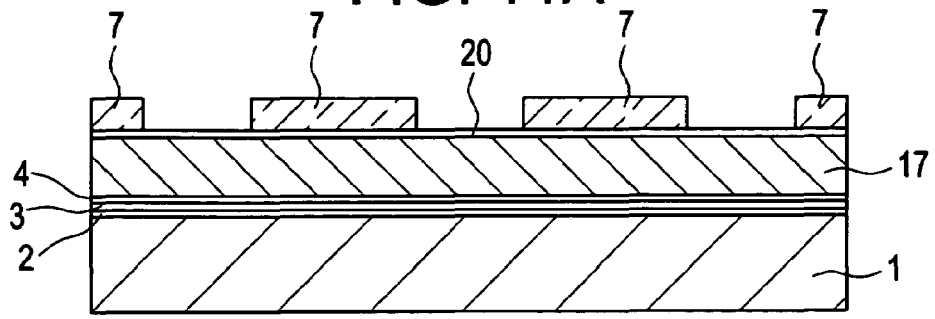
FIGS. 11A through 11D are fragmentary cross-sectional views illustrating a process of manufacturing a nonvolatile semiconductor memory device according to a third embodiment of the present invention.

According to a process of manufacturing the nonvolatile semiconductor memory device according to the third embodiment of the present invention, as shown in FIG. 11A, silicon substrate 1 is thermally oxidized to form first insulating film 2, second insulating film 3, and third insulating film 4, providing an insulating film of ONO structure, as with the second embodiment. Then, conductive film 17 is deposited to cover third insulating film 4 by CVD, and silicon nitride film 20 is grown on conductive film 17.

Figure 11B:
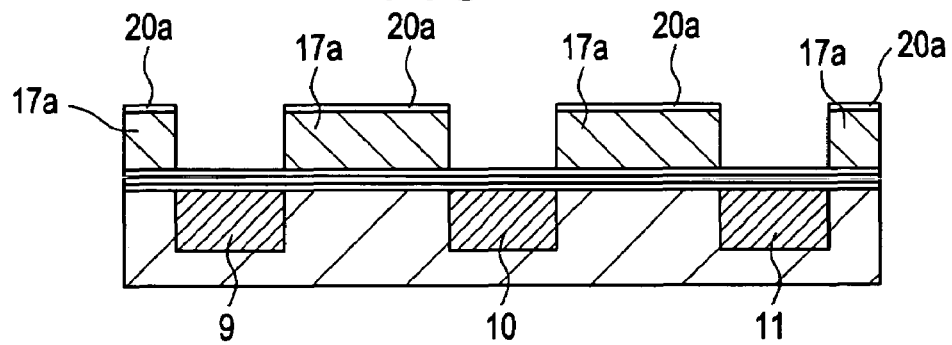

Then, resist mask 7 having a plurality of rectangular openings (slits) is formed on silicon nitride film 20 by a lithographic process. As shown in FIG. 11B, silicon nitride film 20 and conductive film 17 are etched away locally through the openings in resist mask 7 by a dry etching process, forming a pattern of strips as rectangular nitride films 20a and rectangular conductive films 17a, followed by the removal of resist mask 7. Then, an impurity of arsenic is introduced into silicon substrate 1 through the slits between rectangular nitride films 20a and rectangular conductive films 17a, which are used as a mask, by way of ion implantation. The overall structure is heated to activate the introduced impurity, thus forming first diffused layer 9, second diffused layer 10, and third diffused layer 11 in silicon substrate 1 near its surface. Thereafter, first insulating film 2, second insulating film 3, and third insulating film 4 are etched away locally.

Figure 11C:
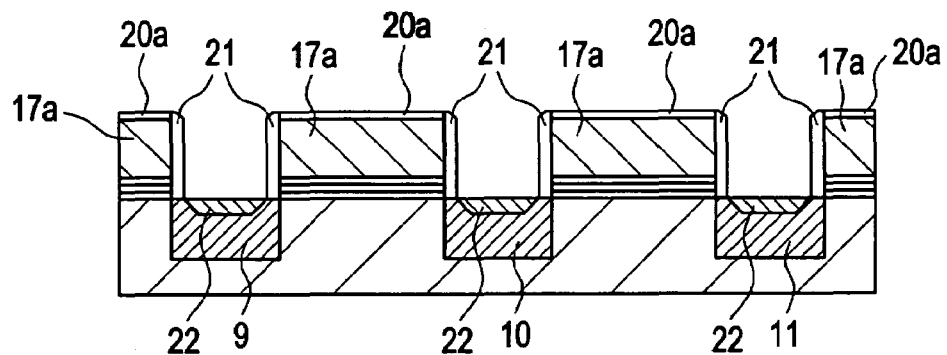

Then, a silicon oxide film is grown to a thickness of about 50 nm on the entire surface CVD, and etched back to form side wall insulating films 21, as shown in FIG. 11C. A cobalt silicide film is deposited on the entire surface by sputtering, and then heated to form silicide layers 22 on first diffused layer 9, second diffused layer 10, and third diffused layer 11. Since rectangular conductive films 17a are coated with rectangular nitride films 20a and side wall insulating films 21, silicide layers 22 are not formed on rectangular conductive films 17a.

Then, in the same manner as with the second embodiment, insulating films 18 are formed on first diffused layer 9, second diffused layer 10, and third diffused layer 11 with silicide layers 22 interposed therebetween, as shown in FIG. 1D.

Figure 11D:
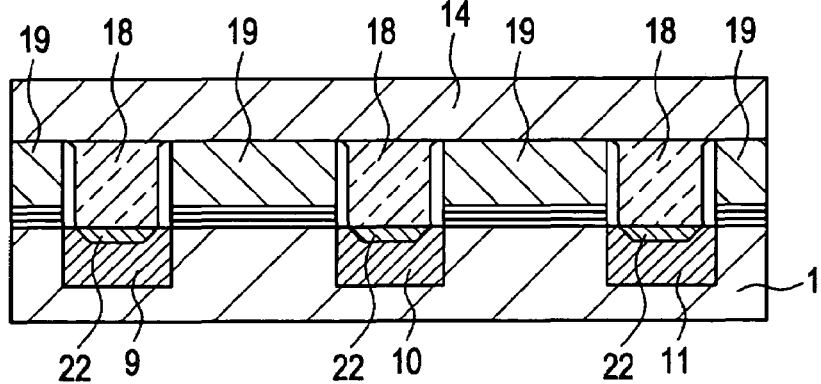

As shown in FIG. 11D, rectangular nitride films 20a are removed, and a tungsten silicide film having a thickness of about 200 nm, which will serve as a second conductive film, is deposited on the entire surface formed so far, and then processed into a desired shape by a known lithographic process and a known dry etching process, thus forming word lines 14. When word lines 14 are formed, rectangular conductive films 17a are also processed into a desired shape by a known lithographic process and a known dry etching process, thus forming gate electrodes 19. In this manner, NROM bit lines including first diffused layer 9, second diffused layer 10, and third diffused layer 11 with silicide layers 22 formed on their surfaces are formed on silicon substrate 1. Word lines 14 are also provided to complete a basic structure of NROM cells of the nonvolatile semiconductor memory device according to the third embodiment.

The third embodiment offers the same advantages as those of the second embodiment. According to the third embodiment, since silicide layers 22 are formed on first diffused layer 9, second diffused layer 10, and third diffused layer 11, the resistance of the bit lines is greatly reduced.

4th Embodiment

A nonvolatile semiconductor memory device according to a fourth embodiment of the present invention will be described below with reference to FIGS. 12A–12D through 14A, 14B.

In the first through third embodiments, an information charge is trapped and retained by the second insulating film in the form of a layer. According to the fourth embodiment, information charges trapped and held by grain-like materials which are hemispherically shaped or dot-shaped, for example.

Figure 12A:
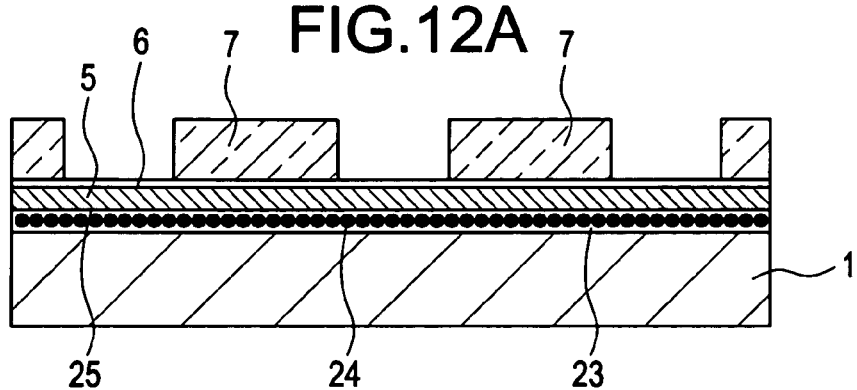
FIGS. 12A through 12D are fragmentary cross-sectional views illustrating a process of manufacturing a nonvolatile semiconductor memory device according to a fourth embodiment of the present invention.

According to a process of manufacturing the nonvolatile semiconductor memory device according to the fourth embodiment of the present invention, as shown in FIG. 12A, silicon substrate 1 is thermally oxidized to form first insulating film 23 thereon by radical or thermal oxidation, as with the first embodiment.

Then, grain-like materials 24 which are hemispherically shaped, for example, are formed on first insulating film 23. Grain-like materials 24 comprise hemispherical masses of silicon nitride each having a diameter of 3 nm.

Hemispherical masses of silicon nitride can be produced by a reduced-pressure CVD process using reactive gases of dichlorosilane ($SiH_2cl_2$) and $NH_3$. When such reactive gases are used, nuclei are formed in an initial phase of the growth of a silicon nitride film. Hemispherical masses of silicon nitride are produced by finishing the growth of the silicon nitride film when those nuclei have reached a suitable size.

After these grain-like materials are formed, third insulating film 25 comprising a silicon oxide film having a thickness of about 5 nm is grown on the entire surface by CVD. The silicon oxide film comprises an HTO film. Third insulating film 25 is deposited in fully covering relation to grain-like materials 24.

Then, as with the first embodiment, silicon layer 5 and silicon nitride film 6 are successively deposited on third insulating film 25 by CVD. Then, resist mask 7 having a plurality of rectangular openings (slits) is formed on silicon nitride film 6 by a known lithographic process.

Figure 12B:
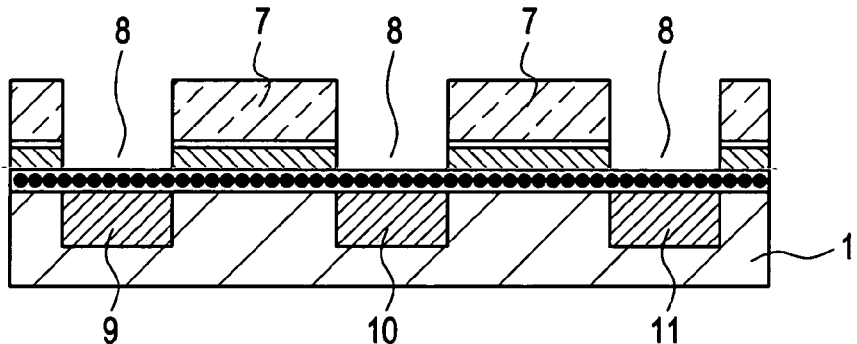

Then, as shown in FIG. 12B, silicon nitride film 6 and silicon layer 5 are successively etched away locally through the openings in resist mask 7 by a dry etching process, forming openings 8 therein. Thereafter, an impurity of arsenic is introduced into silicon substrate 1 through the openings in resist mask 7 by way of ion implantation, followed by the removal of resist mask 7. Then, the overall structure is heated to activate the introduced impurity, thus forming first diffused layer 9, second diffused layer 10, and third diffused layer 11 in silicon substrate 1 near its surface.

Figure 12C:
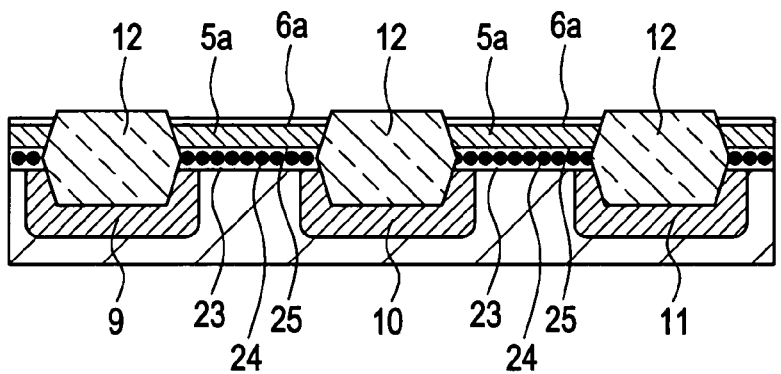

Then, as shown in FIG. 12C, the entire surface formed so far is thermally oxidized to form insulating films 12 having a thickness of about 100 nm on first diffused layer 9, second diffused layer 10, and third diffused layer 11, respectively.

In this manner, an insulating film comprising third insulating film 25, grain-like materials 24, and first insulating film 23 is formed. In this step, silicon layers 5a and silicon nitride films 6a in the shape of strips are formed on third insulating film 25. Thereafter, silicon nitride films 6a in the shape of strips are etched away, and an N-type impurity is introduced into silicon layers 5a in the shape of strips.

Figure 12D:
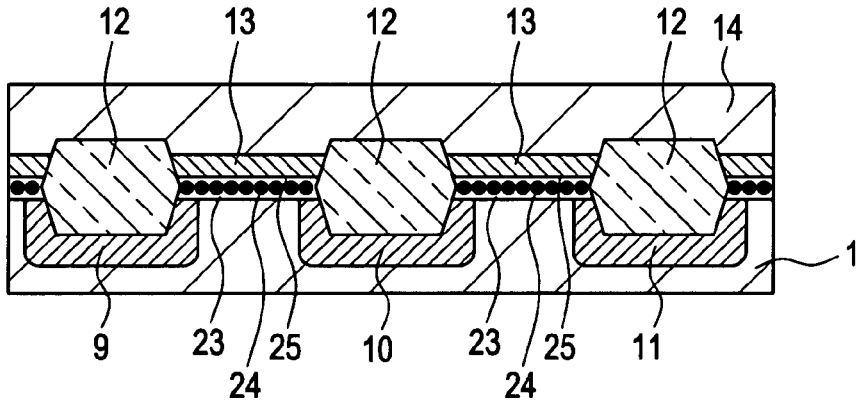

Then, as shown in FIG. 12D, as with the first embodiment, a tungsten silicide film having a thickness of about 200 nm is deposited on the entire surface formed so far, and then processed into a desired shape by a known lithographic process and a known dry etching process, thus forming word lines 14. At the same time that word lines 14 are formed, silicon layers 5a in the shape of strips are also processed into a desired shape, thus forming gate electrodes 19.

In this manner, as shown in FIG. 12D, bit lines comprising first diffused layer 9, second diffused layer 10, and third diffused layer 11 are formed on silicon substrate 101, thus producing regions for writing and erasing information which are made up of first insulating film 23, grain-like materials 24, and third insulating film 25. Word lines 14 are also provided to complete a basic structure of NROM cells of the nonvolatile semiconductor memory device according to the fourth embodiment.

In the fourth embodiment, bit lines or word lines of memory cells are formed in the same fabrication process as with the first embodiment. However, bit lines or word lines of memory cells may be formed in the same fabrication process as with the second or third embodiment.

The nonvolatile semiconductor memory device according to the fourth embodiment has a greatly improved ability to retain information charges. The reasons why the information charge retaining capability is improved will be described below with reference to FIG. 13. FIG. 13 has a horizontal axis which indicates a logarithmic representation of information charge retention times and a vertical axis which indicates threshold values of single NROMs. In FIG. 13, the broken-line curves show information charge retention times of a conventional nonvolatile semiconductor memory device, and the solid-line curves show information charge retention times of a nonvolatile semiconductor memory device according to the present invention.

As shown in FIG. 13, if the threshold value for erasing information is set to 2 V and an information charge is retained with the threshold value of 2 V, then the threshold value increases as the information charge retention time increases. While the threshold value of the conventional nonvolatile semiconductor memory device increases greatly, the threshold value of the nonvolatile semiconductor memory device according to the present invention remains essentially unchanged. If the threshold value for writing information is set to 4 V and an information charge is retained with the threshold value of 4 V, then the threshold value decreases as the information charge retention time increases. While the threshold value of the conventional nonvolatile semiconductor memory device decreases greatly, the threshold value of the nonvolatile semiconductor memory device according to the present invention remains essentially unchanged. According to the fourth embodiment, therefore, the ability to retain information charges is greatly improved.

Advantages of the nonvolatile semiconductor memory device according to the fourth embodiment will be described below. Modifying the above NROM cell structure into a four-bit/one-cell structure will be described below with reference to FIGS. 14A and 14B.

Figure 14A:
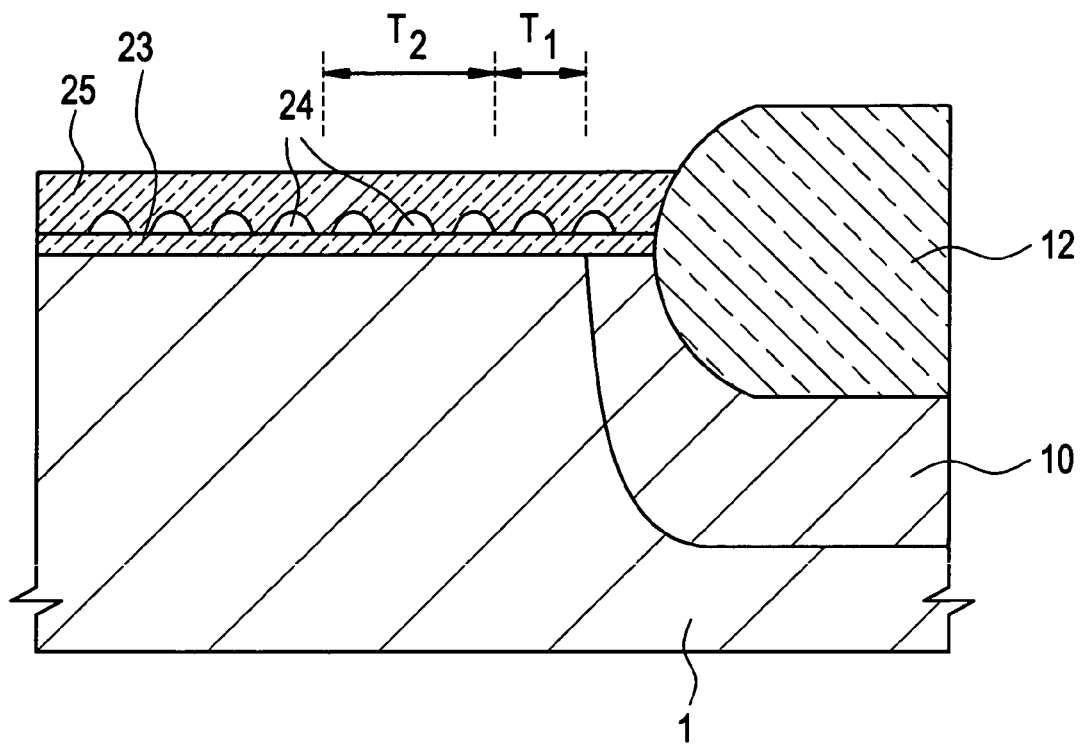
FIGS. 14A and 14B are enlarged fragmentary cross-sectional views of an NROM cell, showing a mechanism of the nonvolatile semiconductor memory device according to the fourth embodiment of the present invention.

As shown in FIG. 14A, the NROM according to the fourth embodiment has an NROM cell bit line comprising second diffused layer 10 disposed on silicon substrate 1 and covered with insulating film 12. First insulating film 23 of oxide silicon is formed in a channel region of the NROM, and grain-like materials 24 of silicon nitride are formed in the channel region of the NROM. Grain-like materials 24 are fully covered with third insulating film 25 of silicon oxide. Usually, silicon nitride has an electric conductivity which is $10^3$ through $10^4$ higher than that of silicon oxide.

A region for writing information, i.e., a trap region, is an interface region between trap centers of grain-like materials 24 or grain-like materials 24, and first insulating film 23 and third insulating film 25. Thus, the trap region is separated by first insulating film 23 and third insulating film 25 which has a high insulating capability. Therefore, electrons introduced into grain-like materials 24 are confined in the trap region, with the result that the NROM has an increased information charge retention capability.

Grain-like materials 24 may be of such a structure that they are formed discretely in an isolated fashion on first insulating film 23 and separated from each other by third insulating film 25. Grain-like materials 24 may be shaped as islands or columns rather than hemispherical bodies.

Figure 14B:
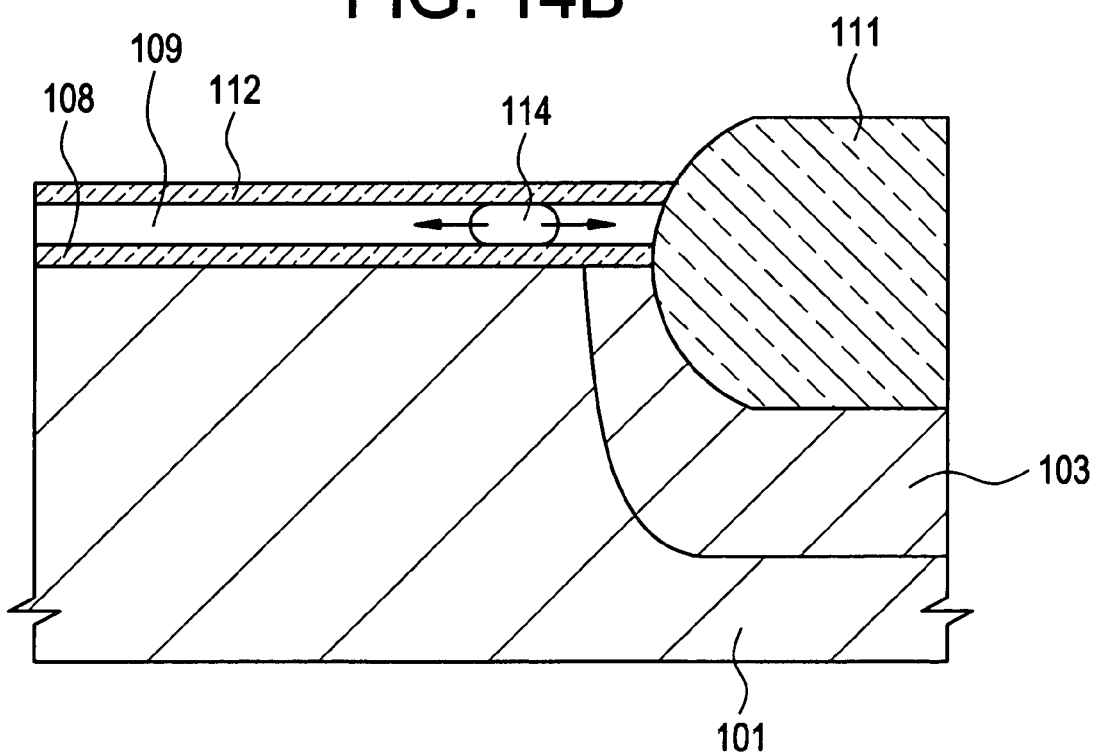

According to a conventional NROM shown in FIG. 14B, a bit line is formed of second diffused layer 103 on silicon substrate 101 and covered with insulating film 111. The ONO structure made up of first insulating film 108, second insulating film 109, and third insulating film 112 provides a region for writing and erasing information, i.e., trap region 114 of the NROM.

With the conventional NROM, electrons introduced into trap region 114 move laterally in second insulating film 109 having a relatively high electric conductivity, as indicated by the arrows. Therefore, the trap region spreads with time, reducing the information charge retention capability.

With the NROM cell structure according to the fourth embodiment, as described above, electrons serving as an information charge are completely confined in grain-like materials 24. This property can be used to achieve a four-bit/one-cell structure.

As shown in FIG. 14A, first range T1 and second range T2 are established in a region near second diffused layer 10. Grain-like materials 24 that are present in first range T1 are referred to as a first trap region, and grain-like materials 24 that are present in either first and second ranges T1, T2 or second range T2 as a second trap region. In this manner, the first trap region and the second trap region can be formed highly accurately in a region corresponding to first trap region 114 shown in FIG. 4. These first and second trap regions serve as two regions for writing and erasing information according to the present embodiment.

Figure 2A:
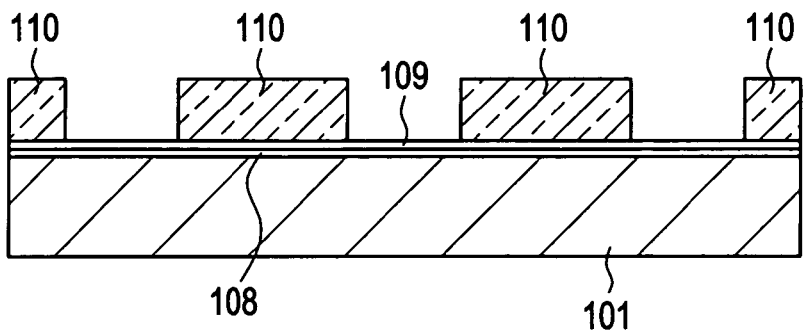
FIGS. 2A through 2D are fragmentary cross-sectional views illustrating a process of manufacturing the conventional nonvolatile semiconductor memory device shown in FIG. 1.
Figure 2B:
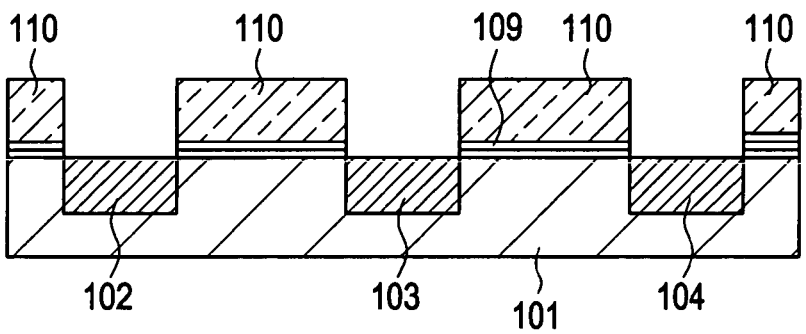
Figure 2C:
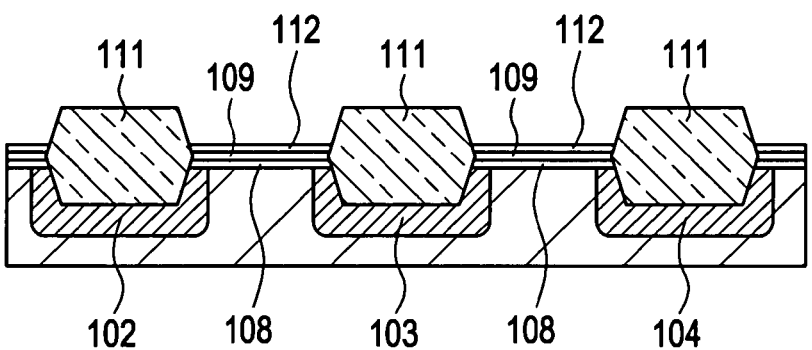
Figure 2D:
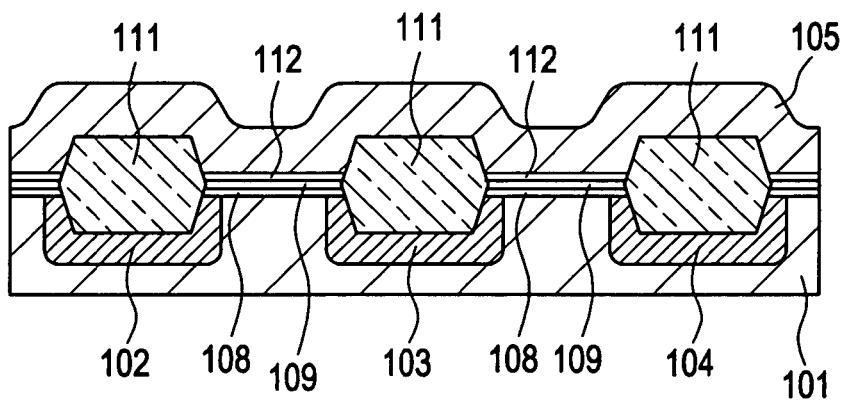
Figure 3A:
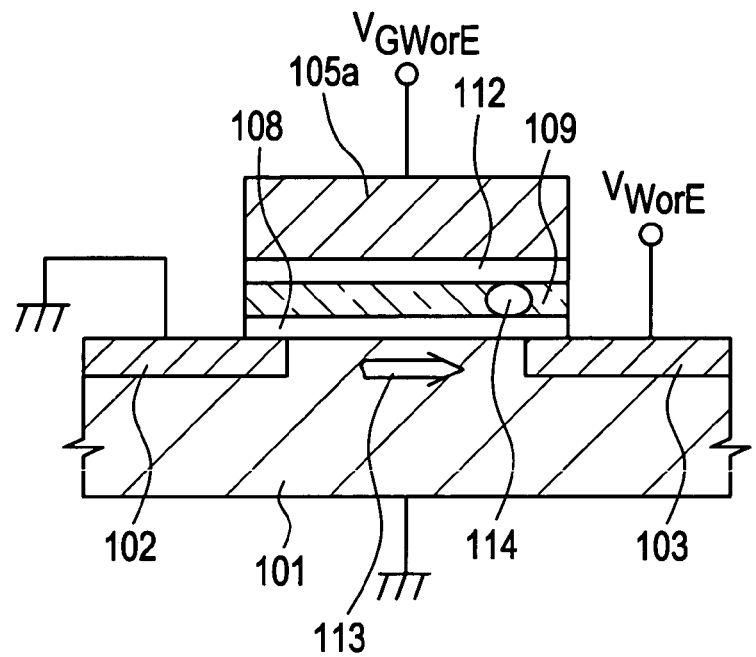
FIGS. 3A and 3B are fragmentary cross-sectional views illustrating the manner in which a MONOS transistor operates.
Figure 3B:
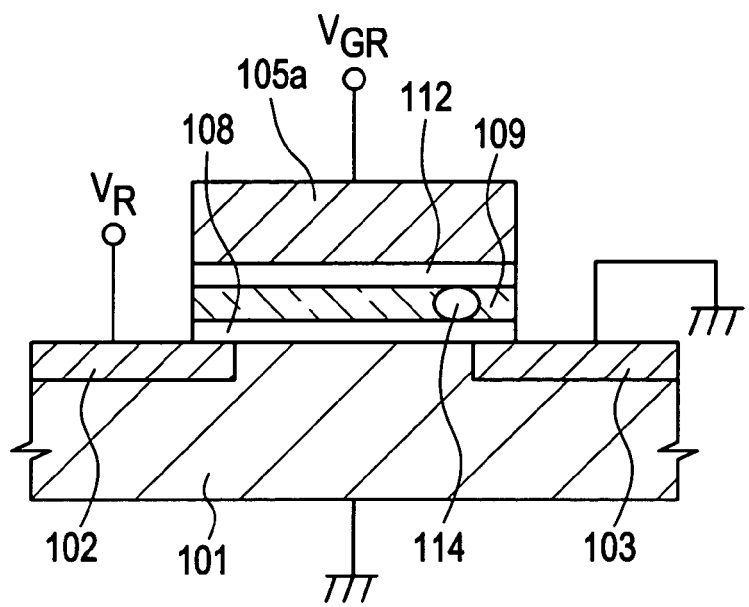
Figure 4:
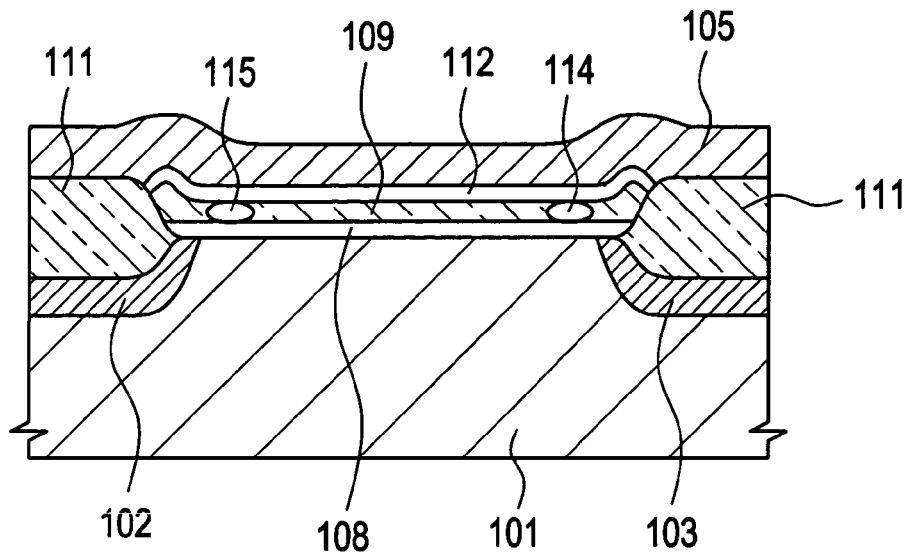
FIG. 4 is a fragmentary cross-sectional view illustrating the manner in which an NROM cell operates.

Although not shown, first and second trap regions can also be established simply in association with first diffused layer 9 which corresponds to second bit trap region 115 described with reference to FIG. 4, thus providing a two-bit×2/one-cell structure.

The above two regions for writing and erasing information may be formed in association with only one of the regions corresponding to first and second bit trap regions 114, 115. In this case, a two-bit/one-cell structure is provided.

The first bit trap region or the second bit trap region can uniquely be generated depending on the condition for writing information. For example, if CHE (Channel Hot Electrons) can be generated in a linear transistor character region of the NROM at the time information is written, then the first bit trap region can be formed. Conversely, if CHE can be generated in a saturated transistor character region of the NROM at the time information is written, then the second bit trap region can be formed. These bit trap regions can be controlled by changing the length of a depletion layer that is generated by a voltage applied to first and second diffused layers 9, 10.

By thus operating the NROM according to the fourth embodiment as a four-bit/one-cell structure, the nonvolatile semiconductor memory device can be designed for a higher packing density and a higher storage capacity, and semiconductor devices for use with logic circuits or memory circuits can also be designed for a multifunction capability.

According to the present embodiment, the first insulating film and the third insulating film of the MONOS transistor comprise a silicon oxide film, and the second insulating film and the grain-like materials thereof comprise a silicon nitride film. However, the present embodiment is not limited to those details. The second insulating film may comprise a metal oxide film such as a tantalum oxide film, or a hafnium oxide film. The grain-like material may comprise a metal oxide film such as a tantalum oxide film or a hafnium oxide film; a semiconductor such as silicon, mixed crystal of silicon and germanium, or germanium; or a metal such as aluminum or tungsten. The first insulating film may comprise a metal oxide film, in which case the second insulating film and the grain-like materials should comprise a metal oxide film different from the metal oxide film of the first insulating film.

According to the present embodiment, the first conductive layer may comprise an amorphous silicon film, a polysilicon film, or a silicon germanium film, and the second conductive layer making up the word lines may comprise a high-melting-point metal film, a silicide film thereof, or a polycide film thereof. The conductive layers may be made of tungsten, molybdenum, cobalt, titanium nitride, and tungsten nitride. These conductive materials may be used in any of various combinations.

While preferred embodiments of the present invention have been described in specific terms, such description is for illustrative purposes only, and it is to be understood that changes and variations may be made without departing from the spirit or scope of the following claims.

What is claimed is:

1. A nonvolatile semiconductor memory device, comprising:
   a first diffused layer and a second diffused layer which serve as bit lines of memory cells formed in a semiconductor substrate near a surface thereof;
   a first insulating layer, a grain-like material, and a third insulating layer which are successively deposited on a channel region between said first diffused layer and said second diffused layer;
   an insulating film formed on said first diffused layer and said second diffused layer; and
   word lines of said memory cells which are formed on said third insulating layer and said insulating film;
   wherein said grain-like material comprises silicon nitride.

2. The nonvolatile semiconductor memory device according to claim 1, wherein said grain-like material has a hemispherical shape, an island shape, or a columnar shape.

3. The nonvolatile semiconductor memory device according to claim 1, wherein two regions for writing and erasing information are formed on a plurality of grain-like materials which are present on said channel region near said first diffused layer and said second diffused layer.

4. The nonvolatile semiconductor memory device according to claim 1, wherein said first insulating layer and said third insulating layer are formed of silicon oxide.

5. The nonvolatile semiconductor memory device according to claim 1, wherein said word lines are formed of a high-melting-point metal, a silicide, or a polycide.

6. A nonvolatile semiconductor memory device according to claim 1, further comprising a silicide layer formed on surfaces of said first diffused layer and said second diffused layer.

7. A nonvolatile semiconductor memory device comprising:
   a semiconductor substrate;
   a first diffused layer and a second diffused layer which serve as bit lines of memory cells formed in said semiconductor substrate;
   a first insulating layer, a second insulating layer, and a third insulating layer which are successively deposited on a channel region sandwiched between said first diffused layer and said second diffused layer;
   a conductive layer deposited on said third insulating layer, and said conductive layer formed above said channel region;
   a fourth insulating layer formed above said first diffused layer;
   a fifth insulating layer formed above said second diffused layer, and said conductive layer sandwiched between said fourth insulating layer and said fifth insulating layer; and
   word lines of said memory cells disposed on said conductive layer and said fourth and fifth insulating layers.

8. A nonvolatile semiconductor memory cell device comprising:
   a semiconductor substrate;
   a first diffused layer and a second diffused layer which serve as bit lines of memory cells formed in said semiconductor substrate;
   a first insulating layer, a second insulating layer, and a third insulating layer which are successively deposited on a channel region sandwiched between said first diffused layer and said second diffused layer;
   a conductive layer deposited on said third insulating layer, and said conductive layer formed above said channel region;
   a plurality of sidewall insulating layers selectively formed on a side of said conductive layer;
   a fourth insulating layer formed in a region sandwiched between said sidewall insulating layers; and
   word lines of said memory cells disposed on said conductive layer and said fourth and fifth insulating layers.

* * * * *